(12) United States Patent
Bartlett et al.

(10) Patent No.: US 9,034,142 B2
(45) Date of Patent: *May 19, 2015

(54) TEMPERATURE CONTROLLED SHOWERHEAD FOR HIGH TEMPERATURE OPERATIONS

(75) Inventors: Christopher M. Bartlett, Beaverton, OR (US); Ming Li, West Linn, OR (US); Jon Henri, West Linn, OR (US); Marshall R. Stowell, Wilsonville, OR (US); Mohammed Sabri, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 965 days.

This patent is subject to a terminal disclaimer.

(21) Appl. No.: 12/642,497

(22) Filed: Dec. 18, 2009

(65) Prior Publication Data

US 2011/0146571 A1    Jun. 23, 2011

(51) Int. Cl.
| | |
|---|---|
| *C23C 16/52* | (2006.01) |
| *H01L 21/306* | (2006.01) |
| *C23C 16/455* | (2006.01) |
| *C23C 16/44* | (2006.01) |

(52) U.S. Cl.
CPC ....... *C23C 16/45565* (2013.01); *C23C 16/4401* (2013.01); *C23C 16/4557* (2013.01); *C23C 16/45572* (2013.01); *C23C 16/52* (2013.01)

(58) Field of Classification Search
CPC ..................... C23C 16/4401; C23C 16/45565; C23C 16/52; C23C 16/45572; C23C 16/4557; C23C 16/45527; C23C 16/45534; C23C 16/45536; C23C 16/45542; C23C 16/45538; C23C 16/4554; C23C 16/45553; C23C 16/45555; C23C 16/45563; C23C 16/4556

See application file for complete search history.

(56) References Cited

U.S. PATENT DOCUMENTS

| | | |
|---|---|---|
| 3,215,508 A | 11/1965 | Piester |
| 4,577,203 A | 3/1986 | Kawamura |
| 4,890,780 A | 1/1990 | Mimata et al. |

(Continued)

FOREIGN PATENT DOCUMENTS

| | | |
|---|---|---|
| CN | 201343570 Y | 11/2009 |
| CN | 200820135478.5 | 11/2009 |

(Continued)

OTHER PUBLICATIONS

Chinese First Office Action, dated Feb. 8, 2014, issued in Application No. 201010602102.2.

(Continued)

*Primary Examiner* — Jeffrie R Lund
*Assistant Examiner* — Satish Chandra
(74) *Attorney, Agent, or Firm* — Weaver Austin Villeneuve & Sampson LLP

(57) ABSTRACT

A temperature controlled showerhead assembly for chemical vapor deposition (CVD) chambers enhances heat dissipation to provide accurate temperature control of the showerhead face plate and maintain temperatures substantially lower than surrounding components. Heat dissipates by conduction through a showerhead stem and removed by the heat exchanger mounted outside of the vacuum environment. Heat is supplied by a heating element inserted into the steam of the showerhead. Temperature is controlled using feedback supplied by a temperature sensor installed in the stem and in thermal contact with the face plate.

34 Claims, 7 Drawing Sheets

(56) References Cited

U.S. PATENT DOCUMENTS

| | | | |
|---|---|---|---|
| 5,232,508 A | 8/1993 | Arena et al. | |
| 5,376,213 A | 12/1994 | Ueda et al. | |
| 5,446,824 A | 8/1995 | Moslehi | |
| 5,452,396 A | 9/1995 | Sopori | |
| 5,653,479 A | 8/1997 | Henderson | |
| 5,806,980 A * | 9/1998 | Berrian | 374/179 |
| 5,834,068 A | 11/1998 | Chern et al. | |
| 5,950,925 A | 9/1999 | Fukunaga et al. | |
| 6,022,413 A | 2/2000 | Shinozaki et al. | |
| 6,054,013 A | 4/2000 | Collins et al. | |
| 6,112,697 A | 9/2000 | Sharan et al. | |
| 6,237,528 B1 | 5/2001 | Szapucki et al. | |
| 6,245,192 B1 | 6/2001 | Dhindsa et al. | |
| 6,289,842 B1 | 9/2001 | Tompa | |
| 6,364,949 B1 | 4/2002 | Or et al. | |
| 6,379,056 B1 | 4/2002 | Ueda | |
| 6,453,992 B1 | 9/2002 | Kim | |
| 6,821,347 B2 | 11/2004 | Carpenter et al. | |
| 6,883,733 B1* | 4/2005 | Lind | 239/424 |
| 6,921,556 B2 | 7/2005 | Shimizu et al. | |
| 7,296,534 B2 | 11/2007 | Fink | |
| 7,712,434 B2 | 5/2010 | Dhindsa et al. | |
| 8,137,467 B2 | 3/2012 | Meinhold et al. | |
| 8,187,679 B2* | 5/2012 | Dickey et al. | 427/569 |
| 8,673,080 B2 | 3/2014 | Meinhold et al. | |
| 2001/0035127 A1* | 11/2001 | Metzner et al. | 118/715 |
| 2002/0144783 A1 | 10/2002 | Tran et al. | |
| 2004/0050496 A1 | 3/2004 | Iwai et al. | |
| 2005/0000423 A1 | 1/2005 | Kasai et al. | |
| 2005/0000442 A1 | 1/2005 | Hayashi et al. | |
| 2005/0017100 A1* | 1/2005 | Watanabe et al. | 239/596 |
| 2005/0173404 A1 | 8/2005 | Benjamin et al. | |
| 2005/0241765 A1 | 11/2005 | Dhindsa et al. | |
| 2005/0242061 A1* | 11/2005 | Fukuda | 216/67 |
| 2006/0137607 A1 | 6/2006 | Seo et al. | |
| 2007/0246163 A1* | 10/2007 | Paterson et al. | 156/345.48 |
| 2007/0275569 A1* | 11/2007 | Moghadam et al. | 438/781 |
| 2008/0053614 A1* | 3/2008 | Sago et al. | 156/345.33 |
| 2009/0095218 A1 | 4/2009 | Meinhold et al. | |
| 2009/0095219 A1 | 4/2009 | Meinhold et al. | |
| 2009/0095219 A1* | 4/2009 | Meinhold et al. | 118/708 |
| 2009/0095220 A1 | 4/2009 | Meinhold et al. | |
| 2009/0095621 A1* | 4/2009 | Kao et al. | 204/298.32 |
| 2009/0260571 A1 | 10/2009 | Ostrowski et al. | |
| 2010/0184298 A1* | 7/2010 | Dhindsa | 438/710 |
| 2011/0011338 A1* | 1/2011 | Chuc et al. | 118/715 |
| 2014/0158792 A1 | 6/2014 | Meinhold et al. | |

FOREIGN PATENT DOCUMENTS

| | | |
|---|---|---|
| CN | 102102194 | 6/2011 |
| JP | 07-045542 | 2/1995 |
| JP | 20-3147392 | 12/2008 |
| KR | 454281 | 6/2011 |
| SG | 152163 | 5/2009 |
| TW | M361710 | 7/2009 |
| TW | 201132793 | 10/2011 |
| WO | 00/42236 | 7/2000 |
| WO | 2005/103323 | 11/2005 |
| WO | WO 2006/022997 | 3/2006 |

OTHER PUBLICATIONS

Chinese Second Office Action, dated Aug. 29, 2014, issued in Application No. 201010602102.2.

U.S. Office Action for U.S. Appl. No. 11/974,945 mailed Sep. 17, 2010.

U.S. Appl. No. 11/974,945, Office Action mailed Mar. 21, 2011.

U.S. Office Action for U.S. Appl. No. 11/974,966 mailed Sep. 17, 2010.

U.S. Appl. No. 11/974,966, Final Office Action mailed Mar. 21, 2011.

U.S. Office Action for U.S. Appl. No. 11/974,966 mailed Sep. 2, 2011.

U.S. Notice of Allowance for U.S. Appl. No. 11/974,966 mailed Jan. 6, 2012.

U.S. Office Action for U.S. Appl. No. 12/181,927 mailed Sep. 17, 2010.

U.S. Final Office Action for U.S. Appl. No. 12/181,927 mailed Mar. 28, 2011.

U.S. Examiner's Answer for U.S. Appl. No. 12/181,927 mailed Dec. 21, 2011.

U.S. Office Action for U.S. Appl. No. 12/148,267 mailed Aug. 17, 2011.

U.S. Office Action for U.S. Appl. No. 12/148,267 mailed Jan. 30, 2012.

Chinese Office Action, dated May 12, 2009, issued in Application No. 200820135478.5.

Korean Office Action, dated Dec. 31, 2010, issued in Application No. 2008-0013796.

SG Search and Examination Report dated May 3, 2010, issued in Application No. 2008/07575-6.

U.S. Patent Board Decision on Appeal dated Aug. 19, 2013 issued in U.S. Appl. No. 12/181,927.

U.S. Notice of Allowance, dated Oct. 25, 2013, issued in U.S. Appl. No. 12/181,927.

SG Search and Examination Report mailed Mar. 5, 2012, issued in Application No. 201009408-4.

\* cited by examiner

TEMPERATURE CONTROLLED SHOWERHEAD FOR HIGH TEMPERATURE OPERATIONS

BACKGROUND

A Chemical Vapor Deposition (CVD) chamber typically includes a showerhead with a perforated or porous planar surface to dispense reactants and carrier gases in a uniform manner over a second parallel planar surface, such as a semiconductor substrate surface. A substrate may be heated to a process temperature at which precursors react resulting in a film deposited on the substrate surface. Showerhead reactors, or parallel-plate reactors, lend themselves to implementation of plasma-enhanced processes, e.g., plasma-enhanced chemical vapor deposition (PECVD). A substrate support (e.g., a pedestal) may be grounded and used as one of the electrodes. A showerhead may be used as another electrode, to which RF power is applied. In another configuration, RF power may be applied to the substrate support, while the showerhead may be grounded.

Deposition uniformity may be negatively affected by variations in process parameters, such as temperatures of the substrate and the showerhead. These variations may appear during process initiation (e.g., before reaching steady state), cleaning cycles, and idling. For example, when a reactor is initially turned on, it may take long time before the temperature of the showerhead is stabilized. The showerhead may be heated by radiation from the substrate (or the substrate pedestal) and by the plasma, which may be introduced at some point during processing causing additional temperature fluctuation. At the same time, the showerhead may loose some heat to the process gases flown through the showerhead and due to radiation from its external surfaces. Further, temperature variation may be caused by other more permanent changes in the system, such as drifts in surface emissivity of the showerhead. Variable temperature may cause substantial non-uniformity of the deposited films. Furthermore, operating a showerhead at high temperatures shortens its operating life and leads to particle contamination. For example, temperatures above 300° C. can result in rapid formation of aluminum fluoride on an aluminum showerhead surface. The aluminum fluoride tends to flake off and fall onto the substrate below.

New apparatuses and methods are needed to more precisely control showerhead temperature and to operate showerheads at lower temperatures.

SUMMARY

A temperature controlled CVD showerhead with enhanced heat transfer features provides accurate and stable temperature control and reduces temperature fluctuations caused by variations in the chamber. Such showerhead is capable of quick recovery to the temperature set point when changes in the operating environment perturb the system (e.g., turning on a plasma generator, introducing a new substrate onto the pedestal, changing flow rates of process gases). Accurate temperature control improves substrate-to-substrate uniformity.

A temperature sensor is used to monitor the face plate temperature and to provide a feedback for controlling the heating element and/or the heat exchanger. Effective heat transfer paths exist between the face plate and the heating element as well as between the face plate and the heat exchanger allowing for efficient heat supply or removal from the face plate. Heat transfer characteristics are driven by large cross-sectional profiles of the back plate and the stem. Further, materials having high thermal conductivity, such as aluminum 6061-T6, are used for construction of the elements. Heat transfer is driven by a temperature gradient established by passing high thermal capacity cooling fluids through the heat exchanger and high power heating elements installed in the stem.

Heat transfer and dissipation characteristics coupled with accurate temperature control allow operating a showerhead at temperatures substantially lower (e.g., between about 100° C. and 300° C.) than the temperature of the nearby pedestal despite substantial heat flux from the pedestal to the face plate. Lower temperatures extend the operating lifetime of the showerhead and minimize particle contamination. In certain embodiments, heat dissipation is also a result of providing high emissivity external surfaces on the back plate and the stem.

A heating element, a heat exchanger, and a temperature sensor can be easily removed from the showerhead. In certain embodiments, these components can be replaced without impacting the internal environment of the deposition chamber. In other words, the deposition chamber may be maintained at a low operating pressure while one or more of the abovementioned showerhead assembly components are replaced. Removable components simplify troubleshooting and maintenance of the showerhead and the overall deposition system and minimizes its downtime.

In certain embodiments, a temperature controlled showerhead assembly for use in a chemical vapor deposition (CVD) apparatus includes a heat conductive stem, a back plate attached to the heat conductive stem, a face plate thermally coupled to the heat conductive stem and attached to the back plate, a heating element thermally coupled to the heat conductive stem, a heat exchanger thermally coupled to the heat conductive stem, and a temperature sensor thermally coupled to the face plate. The temperature controlled showerhead may be configured to maintain the temperature of the face plate within a predetermined range by providing heat transfer paths between the removable heating element and the face plate and between the removable heat exchanger and the face plate. The face plate may have multiple through holes configured for uniform distribution of process gases. In particular embodiments, a heating element, a heat exchanger, and/or a temperature sensor are removable from the temperature controlled showerhead assembly.

A solid cross-section of the heat conductive stem may be at least about 5 square inches on average along the length of the shaft portion. A heat conductive stem, a back plate, and/or a face plate may be made of a material with a thermal conductivity of at least about 150 Watts per meter per Kelvin. In particular embodiments, a heat conductive stem, a back plate, and/or a face plate are made of aluminum 6061 and aluminum 3003. An average thickness of the back plate may be at least about 2 inches, while an average thickness of the face plate is between about 0.5 inches and 1 inch. An average gap between the face plate and the back plate may be between about 0.25 inch and 0.75 inch. A contact area between the face plate and the back plate may be between about 30 square inches and 50 square inches. A face plate may have a diameter of between about 13.5 inches and 16.5 inches.

In certain embodiments, a heat exchanger includes a convective cooling fluid passageway configured to allow for a flow of a cooling fluid. The cooling fluid may be water or a liquid antifreeze solution. In the same or other embodiments, a heat exchanger is positioned within about 7 inches from the face plate. A temperature controlled showerhead assembly may be configured to maintain the temperature of the face place at between about 200° C. and 300° C. for an emissivity of the face plate at between about 0.2 and 0.8. In certain embodiments, a heating element includes two cartridge heaters each configured to provide power output of at least about 500 W.

A stem may include a top surface. A heating element may be positioned within the stem and configured to be placed into the stem and removed from the stem through the top surface. Further, a temperature sensor may be positioned within the stem and configured to be placed into the stem and removed from the stem through the top surface.

In certain embodiments, an external surface a stem and/or a back plate has high emissivity. For examples, the high emissivity surface may be anodized aluminum.

In certain embodiments, a Chemical Vapor Deposition (CVD) system for depositing a semiconductor material on a partially manufactured semiconductor substrate includes a processing chamber configured to maintain a low pressure environment within the processing chamber, a substrate support for holding the partially manufactured semiconductor substrate and maintaining a temperature of the partially manufactured semiconductor substrate at between about 500° C. and 600° C., and a temperature controlled showerhead assembly. The temperature control showerhead assembly may further include a heat conductive stem, a back plate attached to the heat conductive stem, a face plate thermally coupled to the heat conductive stem and attached to the back plate, a heating element thermally coupled to the heat conductive stem, a heat exchanger thermally coupled to the heat conductive stem, and a temperature sensor thermally coupled to the face plate. The temperature controlled showerhead is configured to maintain the temperature of the face place within a predetermined range by providing heat transfer paths between the heating element and the face plate and between the heat exchanger and the face place. The face plate of the temperature controlled showerhead may be positioned within about 0.7 inches from the substrate support. The temperature controlled showerhead may be configured to maintain the temperature of the face plate at between about 200° C. and 300° C. while the substrate support is maintained at between about 500° C. and 550° C. In certain embodiments, a CVD system also includes an in-situ plasma generator.

In certain embodiments, a CVD system is a single-station deposition system. In other embodiments, a CVD system includes a second substrate support. The first substrate support and the second substrate support may be positioned inside the same processing chamber and configured to be exposed to the same environment. In other embodiments, a CVD system also includes a second processing chamber configured to maintain a different environment. The first and second substrate supports may be positioned in different processing chambers (e.g., the first processing chamber and the second processing chamber).

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

In this application, the terms "substrate" and "wafer" will be used interchangeably. The following detailed description assumes the invention is implemented on semiconductor processing equipment. However, the invention is not so limited. The apparatus may be utilized to process work pieces of various shapes, sizes, and materials. In addition to semiconductor wafers, other work pieces that may take advantage of this invention include various articles such as display face planes printed circuit boards and the like.

Figure 1:
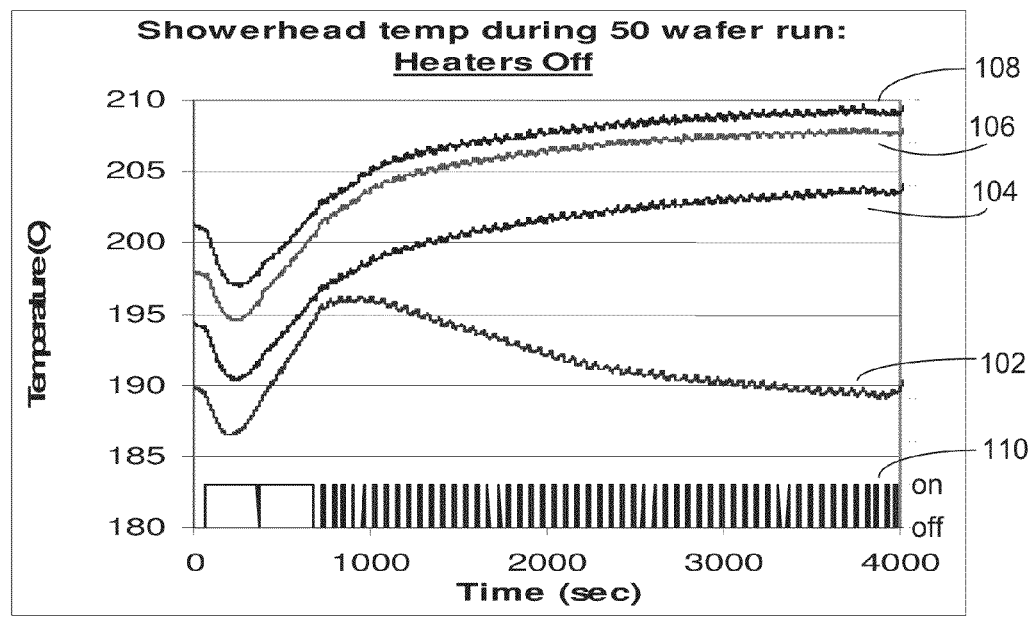
FIG. 1 is a graph of showerhead temperatures in a four station chamber over time.

Showerhead temperatures drift over time and affect deposition reaction rates and film properties. FIG. 1 is a graph of four showerhead temperatures in a four station deposition chamber over a 50 wafer run without any temperature control, i.e., no heating or cooling applied to the showerheads. The first station showerhead temperature corresponds to line 102. The second station showerhead temperature corresponds to line 104. The third station showerhead temperature corresponds to line 106. And, finally, the fourth station showerhead temperature corresponds to line 108. Over time, the showerhead temperatures of the second, third, and fourth stations increased until they reached a steady state temperature at about 3700 seconds. The plasma condition in the chamber is represented as a step function with line 110. Initially, the plasma was provided in a dummy deposition mode to warm up the showerheads, and after about 10 minutes the wafer processing began. In the first station, the temperature started to decrease gradually after wafer processing began because each incoming wafer (that is substantially colder than the showerhead) at that station cools the chamber components, including the showerhead, as the wafer is warmed up to the process temperature. Thus, the temperature profiles in the subsequent stations are progressively higher. The second station showerhead was cooler than the third station showerhead because the incoming wafer to the second station was cooler than the incoming wafer to the third station. For all stations, the showerhead temperature reached an equilibrium temperature after some time.

FIG. 1 illustrates that a substrate being processed in a multi-station chamber would experience different showerhead temperatures at different stations. The same problem appears in a typical single-station chamber. For example, a showerhead temperature can fluctuate while multiple sub-layers are deposited on that station. During deposition, heat transfer in the showerhead is a dynamic process impacted by a pedestal temperature, plasma presence and its power, and other factors. If not effectively controlled, a showerhead experiences substantial temperature deviations. In situations when a showerhead temperature impacts deposited film properties, each layer deposited using a different showerhead on the same wafer may result in different properties. One CVD process example that is particularly sensitive to fluctuations in showerhead temperature is deposition of silicon nitride spacers. Another such example is deposition using a tetraethylorthosilicate (TEOS) precursor.

Figure 2A:
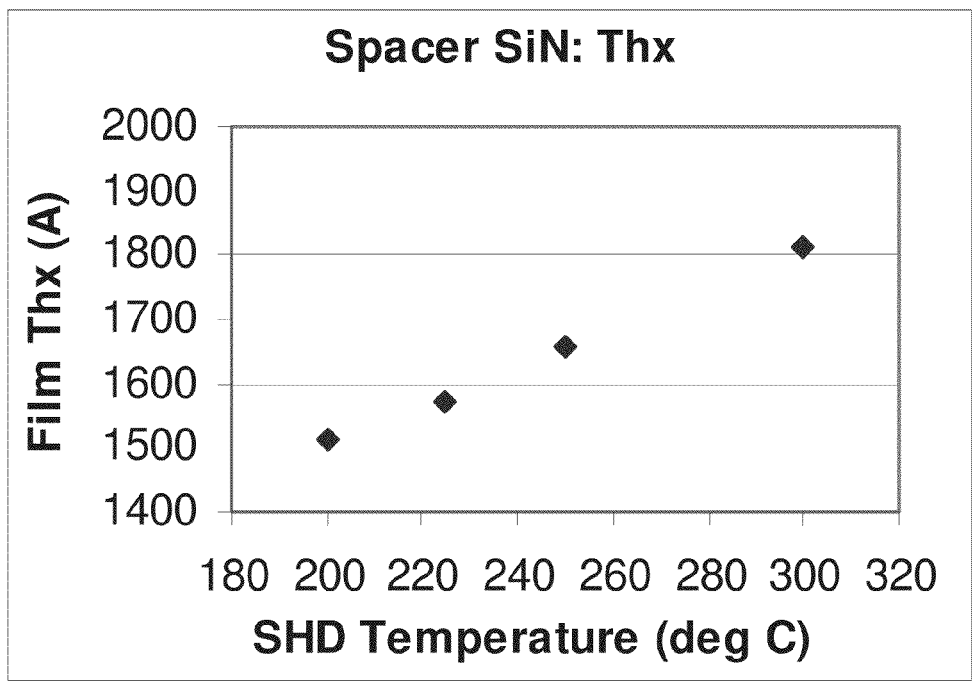
FIG. 2A is a graph of silicon nitride spacer thickness deposited at various showerhead temperatures.
Figure 2B:
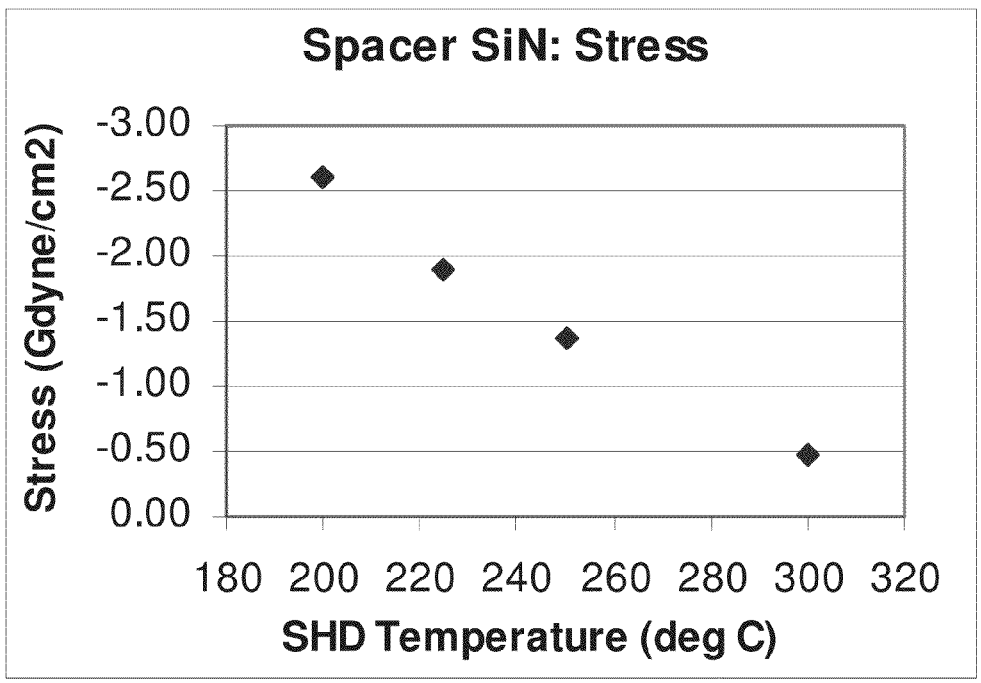
FIG. 2B is a graph of film stress for silicon nitride spacer deposited at various showerhead temperatures.

Differences in film properties resulting from different showerhead temperatures are illustrated in the following two examples. FIG. 2A shows a plot of film thicknesses deposited at different showerhead temperatures. With all other process parameters kept constant, higher showerhead temperatures resulted in thicker films. Thus, a layer deposited at the beginning of a wafer run (e.g., after some idle time or chamber cleaning and while the showerhead is still relatively cold) would be thinner than a layer deposited once the process reaches steady state. FIG. 2B illustrates effects of the showerhead temperature on stress of a silicon nitride spacer film. As the showerhead temperature increases, the stress level decreases. Variations in stress level may have a negative impact on device performance (e.g., transistors).

A temperature controlled showerhead improves substrate-to-substrate uniformity both for bulk films and individual sub-layers in single-station and multi-station apparatuses, increases throughput by eliminating non-processing delays (e.g., to stabilize temperature), reduces particle contamination by operating a showerhead at lower temperatures, and allows for better control of various film properties. In certain configurations, more precise control ensures that multiple showerheads in the chamber are operated with substantially similar process parameters and close to the target parameters. As a result, film properties of different sub-layers are better controlled.

Improving temperature control and providing more adequate heat paths may be used to reduce thermal cycling of the showerhead. In other words, the showerhead temperature may be maintained at comparable levels during deposition, idling, and/or cleaning. The reduction in thermal cycling increases processing throughput (by minimizing or eliminating temperature ramp-up and stabilization periods) and helps to reduce particle contamination caused by flaking of deposits on the surface of the showerhead. Deposits on the surface of the showerhead have different thermal expansion coefficients than the materials of the showerhead, resulting in flaking of the deposits during thermal cycling.

Particle contamination may also be reduced by lowering operating temperatures of the showerhead. Even though substrates are processed at about 400° C.-600° C. in close proximity to the showerhead, effective heat transfer coupled with heat dissipation allows maintaining the face plate of the showerhead at between about 200° C. and 300° C. It should be noted that for the purposes of this document showerhead temperature references are provided for the face plate unless otherwise stated. Heat is removed by transferring it from the face plate through the back plate and the stem to a heat exchanger, by radiation from the back plate, and/or a combination thereof. In addition to reduction of particle contamination, certain CVD processes require lower showerhead temperatures to achieve certain film properties. For example, lowering showerhead temperature improves stress levels in certain films, as evidenced by FIG. 2B.

In general, there are two main types of CVD showerheads: a chandelier type and a flush mount type. A chandelier type showerhead has a stem attached to the top of the chamber on one end and a face plate on the other end. A part of the stem may protrude from the chamber top for connecting gas lines and RF power. A flush mount showerhead type is integrated into the top of a chamber and typically does not have a stem. This document generally refers to the chandelier type of showerheads, however it should be understood that certain features could be used in flush mount showerheads as well, as would be readily understood to one of skill in the art given the description provided herein.

Showerhead temperature changes when heat is added or removed. Some of this heat is added or removed in a controllable fashion, e.g., based on a current registered temperature and a set point. Various components of the showerhead further described below enable this controllable process. However, some heat is transferred due to changes in surrounding conditions and this transfer has to be compensated for in order to maintain a stable temperature. For example, heat is added to the showerhead when the plasma is turned on due to the collision of charged particles with the showerhead. Furthermore, the showerhead may be heated by other surrounding components, such as a processed wafer or a pedestal. The showerhead looses heat when colder materials are introduced into the chamber, e.g., reactant gases supplied through the showerhead or a substrate introduced from a load-lock or another colder station. Further, heat is lost due to conduction to other chamber components (e.g., through the showerhead stem material to the chamber ceiling) and radiation (e.g., from the back plate).

Figure 3A:
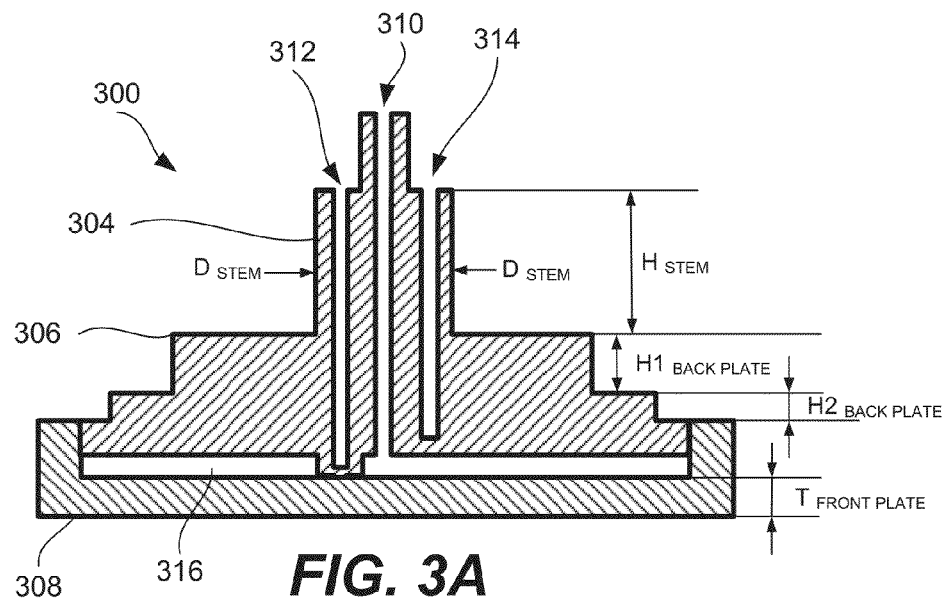
FIG. 3A is a cross-sectional view of the temperature controlled showerhead in accordance with certain embodiments.

FIG. 3A is a schematic cross-sectional view of a temperature controlled showerhead 300 in accordance with certain embodiments of the invention. A showerhead 300 may be a part of the showerhead assembly further described in the context of FIG. 5 and a part of the deposition system further described in the context of FIG. 7. The showerhead 300 includes a heat conductive stem 304, a back plate 306, and a face plate 308. The stem 304 and the back plate 306 may be separate mechanical components or integrated into a single body. In a similar manner, the back plate 306 and the face plate 308 may be separate mechanical components or integrated into a single body. For example, two or more of these components may be manufactured together from a single block of material or attached together after the fabrication (e.g., welded, pressed, fused together) in such a way that these components cannot be easily separated. The latter approach may provide for better heat transfer between integrated components. However, removably attached components may be preferable in embodiments where one or more components may need to be periodically changed. For example, a face plate 308 may be removably attached to the back plate 306 to allowing for servicing of a manifold area 316, to replace a face plate 308 when one wears out, or to replace a face plate 308 with another one having a different distribution pattern (e.g., a hole pattern on the bottom surface further described in the context of FIG. 4B). In a similar manner, the back plate 306 may be removably attached to the face plate 308 and/or to the stem 304. In certain embodiments, a back plate 306 may be replaced with a different back plate that has different thermal transfer characteristics.

In certain embodiments, the stem 304 has a cylindrical shape with an average diameter ($D_{STEM}$ as shown in FIG. 3A) of between about 2 inches and 4 inches or, more specifically, between about 2.5 inches and 3.5 inches or, even more specifically, between about 2.75 inches and 3.25 inches. It should be noted that dimensions presented in this document correspond to a showerhead configured for processing 300-mm wafers, unless otherwise noted. It should be understood that other dimensions may be used for showerheads configured to process different substrate types and sizes (e.g., 200-mm wafers, 450-mm wafers, etc.).

Another way of characterizing the stem 304 is based on its solid cross-sectional area (i.e., a cross-section material surface that excludes any openings). In certain embodiments, such cross-sectional is on average between about 3 square inches and 10 square inches or, more specifically between about 4 square inches and 8 square inches. The height of the stem 304 ($H_{STEM}$ as shown in FIG. 3A) may be on average between about 1 inch and 5 inches or, more specifically, between about 2 inches and 4 inches or, even more specifically, between about 2.5 inches and 3.5 inches.

Figure 5:
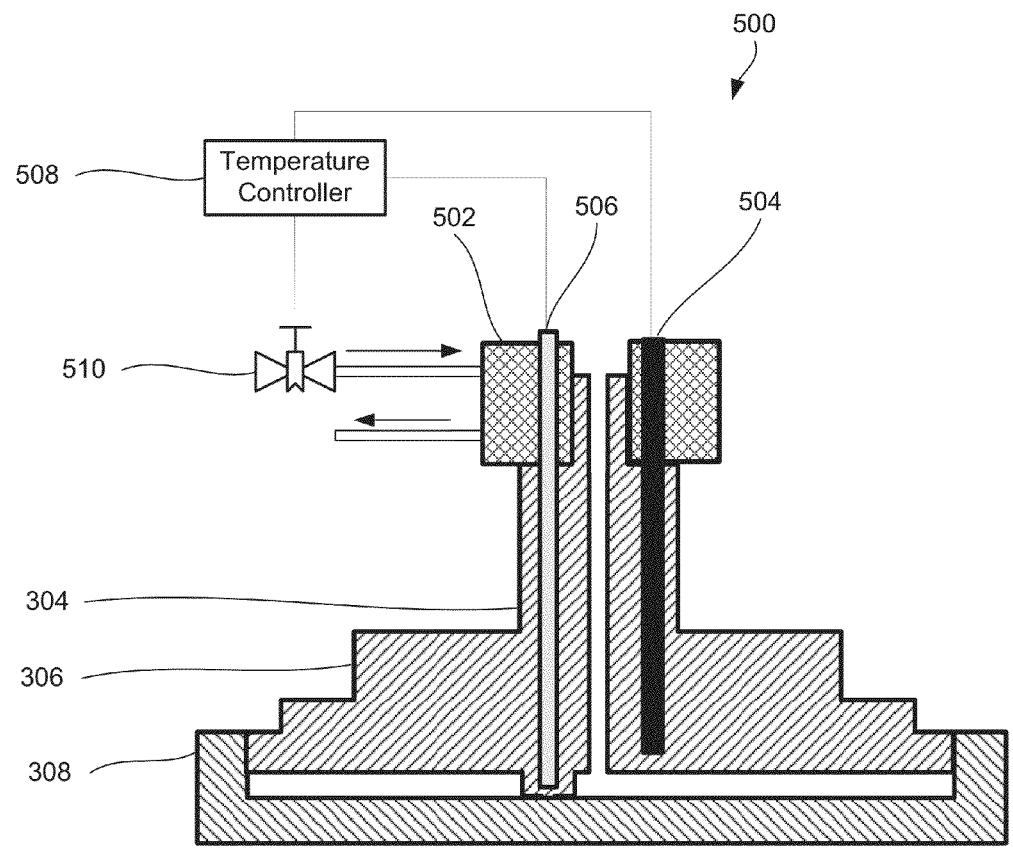
FIG. 5 is a schematic view of the temperature controlled showerhead assembly in accordance with certain embodiments.

However, the length of the stem may be less relevant for a thermal analysis than, for example, the distance to a heat exchanger thermally coupled to the stem as discussed in the context of FIG. 5. Further, any features provided in the stem, such as a process gas feed opening 310, a temperature sensor opening 312, and a heating element opening 314 should be accounted for when analyzing heat conductivity of the stem. Other thermal analysis considerations include thermal properties of the materials used for stem construction (e.g., heat conductivity, heat capacity), a temperature gradient, thermal coupling to other elements (e.g., a heat exchanger, a back plate), and others.

Figure 3B:
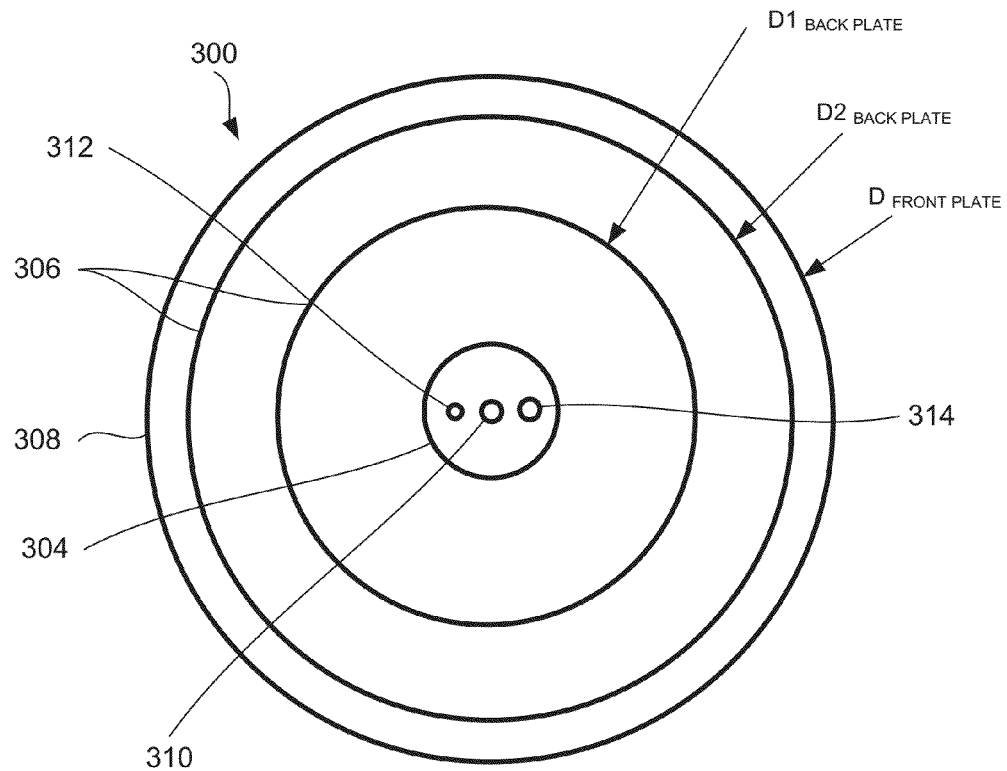
FIG. 3B is a top view of the temperature controlled showerhead in accordance with certain embodiments.

The back plate 306 may also have a cylindrical shape. In certain embodiments, the back plate 306 may be characterized as a stack of disks as shown in FIGS. 3A and 3B. For example, a stack may include two, three, four, five, or more disks. In particular embodiments, the back plate is a stack of three disks. The largest disk, which is typically positioned at the bottom of the stack and in the contact with the face plate 308, may have a diameter (not referenced in the drawings) of between about 12 inches and 14 inches and a thickness (not referenced in the drawings) of between about 0.5 inches and 1 inch. Another disk may be between about 0.5 inches and 1.5 inches smaller in diameter ($D2_{BACK\ PLATE}$ in FIG. 3B) than the largest disk and have a thickness ($H2_{BACK\ PLATE}$ in FIG. 3A) of between about 0.5 inches and 1 inch. Yet another cylinder may be between about 2.0 inches and 4.0 inches smaller in diameter ($D1_{BACK\ PLATE}$ in FIG. 3B) than the largest cylinder and have a thickness ($H1_{BACK\ PLATE}$ in FIG. 3A) of between about 1.0 and 2.0 inches.

Generally, various disk stacks described above form a single unified body (e.g., fabricated from a single block of material or permanently attached together using welding, pressing, fusing, or other techniques). In certain embodiments, each disk may be a separate component that can be stacked together with other disks of the same or different sizes in a modular fashion to form a back plate. The number and size of the disks may be selected based on the heat transfer requirements and may be reconfigured into another stack for different requirements.

The face plate 308 may be slightly larger than the substrate, for example, between about 100% and 125% larger that the substrate or between about 14 inches and 16 inches in diameter ($D_{FRONT\ PLATE}$ in FIG. 3B) for a 300-mm wafer showerhead type. To ensure thermal uniformity throughout the face plate 308 and to conduct heat to and from the back plate 306, the face plate may have a thickness ($T_{FRONT\ PLATE}$ in FIG. 3A) of at least about 0.5 inches or, more specifically, between about 0.5 inches and 1 inch or, even more specifically, between about 0.7 inches and 0.8 inches. Further, a combination of the front plate 308 and the back plate 306 may be characterized by a contact area between the two, which, in certain embodiments, may be between about 10 square inches and 30 square inches or, more specifically, between about 15 square inches and 25 square inches. As shown in FIGS. 3A-B, the contact area may be shaped as a ring with a diameter of between about 12 inches and 16 inches and a cross-section of between about 0.25 inches and 1 inch.

Showerhead components described above may be fabricated from materials that are capable of operating in environments (e.g., fluoride based chemicals, plasma) and conditions (e.g., temperatures of up to about 600° C.) of a typical CVD chamber. Examples of materials include aluminum (e.g., grade 6061-T6, 3003-O, 3003-H12), stainless steel, and ceramics (e.g., alumina).

Process gases are introduced through a gas feed channel 310 in the stem 304 and flow through the back plate 306 before entering the manifold area 316 between the back plate 306 and the face plate 308. The manifold area 316 may include a baffle (not shown) for distributing the process gases evenly throughout the area 316. The gap between the back plate 306 and the face plate 308 may be on average between about 0.25 inches and 1 inch.

Figure 4A:
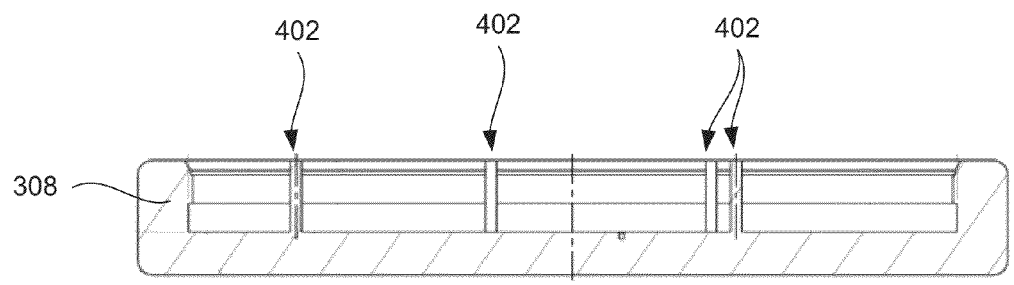
FIG. 4A is a cross-sectional view of the face plate in accordance with certain embodiments.

To maintain uniform gas flow in the manifold area 316, the gap may be kept constant with a number of separator/spacers positioned between the back plate 306 and the face plate 308 at various locations, e.g. 3, 6, or up to 10 locations. In certain embodiments, as shown in FIG. 4A, separator/spacers 402 are a part of the face plate 308. The back plate 306 may be attached through separator/spacers 402 to the face plate 308 by means of welding, or brazing. Alternatively, the back plate 306 may be fastened through separator/spacers to the face plate 308 at threaded blind holes (not shown) In other embodiments, variously shaped spacers or bushings with or without internal threads may be used. Although the screws are described to enter the back plate 306 and to thread into the face plate 308, the reverse configuration may be used (i.e., entering through the face plate 308 and threading into the back plate 306).

Returning to FIGS. 3A and 3B, the stem 304 may also include an opening for inserting a temperature sensor, i.e., a temperature sensor thermo-well. The opening 312 may be sealed away from the manifold area 316 to prevent process gases from escaping through the opening 312. The opening 312 may allow replacing a temperature sensor without disassembling the showerhead 300. In certain embodiments, a temperature sensor could be replaced while the showerhead 300 is attached to a deposition chamber maintained at its operating pressures.

The temperature sensor opening 312 is configured in such a way that an installed sensor (element 506 in FIG. 5; not shown in FIGS. 3A and 3B) is thermally coupled with the face plate 308. For example, a back plate 306 may have a feature extending into the manifold area 316 that establishes a more direct contact with the face plate 308 than, for example, through the contact area around the perimeter of the showerhead 300. In this configuration, a temperature sensor provides a fast response about the current temperature of the face plate and allows modifying the heat flux through the showerhead.

The stem 304 may also have one or more opening for inserting heating elements, i.e., the heating element opening 314 as illustrated in FIGS. 3A and 3B. This opening 314 is sealed from the manifold area 316. When a heating element (element 504 in FIG. 5; not shown in FIGS. 3A and 3B) is installed into the opening 314, it becomes thermally coupled with the stem 304 and/or the back plate 306. Thermal coupling of the heating element to the face plate 308 is established through the stem 304 and the back plate 306. In certain embodiments, a heating opening 314 is configured to accommodate a cartridge heater. For example, an opening 314 may have a diameter of between about 0.25 inches and 0.5 inches or, more specifically, between about 0.35 inches and 0.4 inches, and a depth of between about 3 inches and 7 inches or, more specifically, between about 4 inches and 6 inches.

Figure 4B:
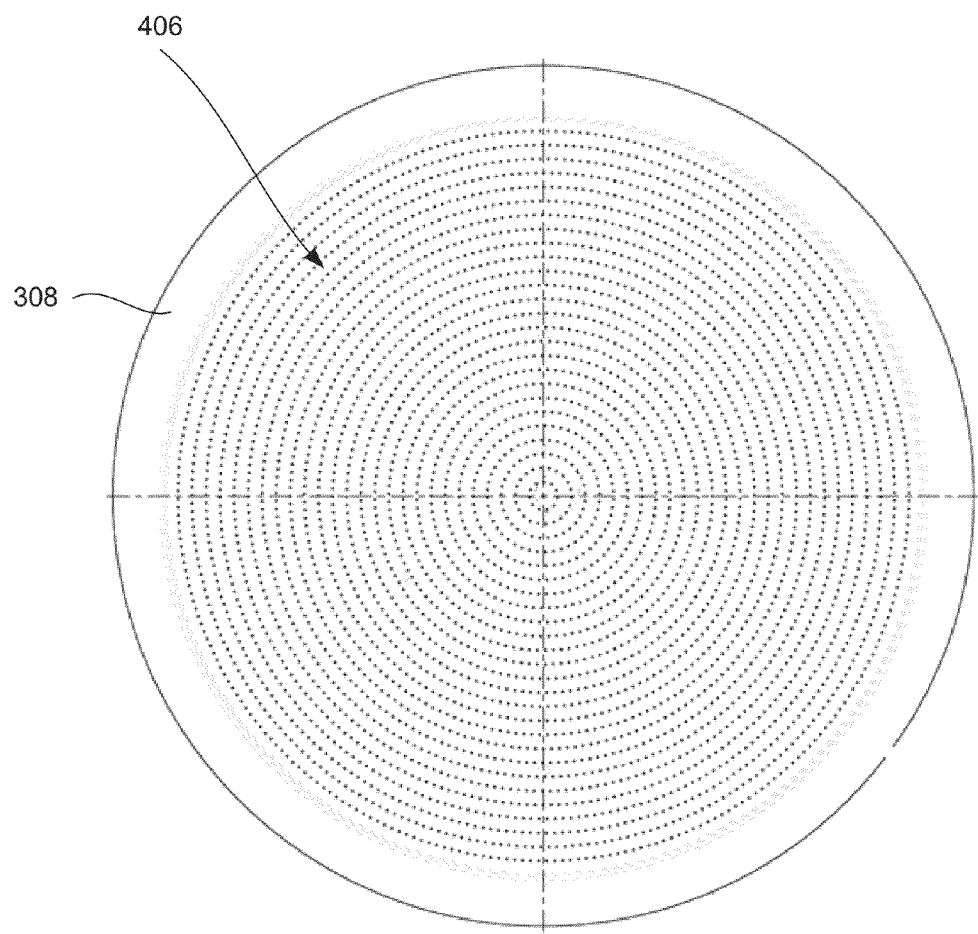
FIG. 4B is a bottom view of the face plate in accordance with certain embodiments.

FIG. 4B illustrates a bottom view of the face plate 308 in accordance with certain embodiments. The face plate 308 has a plurality of holes or perforations 406 to provide even distribution of process gases from the manifold area 316 into the deposition chamber. A particular example of such holes is shown in FIG. 4B. The through holes may be machined, milled, or drilled, for example. Each hole may be between about 0.01 inches and 0.25 inches in diameter or, more specifically, between about 0.02 inches and 0.1 inches. In particular embodiments, a diameter of the holes 406 is about 0.04 inch in diameter. Some holes may have different sizes than others. For example, hole sizes may increase further away from the gas feed line 310. The number of holes may be between about 100 and 10,000 or, more specifically between about 1,000 and 5,000. In particular embodiments, the number of holes is between about 3,750 and 4,000. The holes may be distributed evenly throughout the face plate 308 in various patterns, e.g., a honey comb pattern or increasingly larger circles. In particular embodiments, a number of circles that establishes the pattern is between about 5 and 50 circles or, more specifically, between about 20 and 40 circles or, even more specifically, between about 25 and 30 circles. For example, one hole may be in the center, followed by 6-15 holes positioned at the same distance from the center hole (i.e., a circular pattern), followed by another 12-30 holes positioned also at the same distance from the center hole, but this second distance is twice the first distance, and so on. In certain embodiments, the first distance is between about 0.20 inches and 0.30 inches. Further, holes 406 may form various patterns with uneven distribution, such as being more densely packed around the edges than in the middle of the face plate or vice versa. Generally, distribution of the holes 406 in the face plate 308 depends on various factors, such as desired film uniformity, film profile, and process gas parameters (e.g., viscosity, flow rate).

In some embodiments, the face plate 308 is removably attached to the back plate 306 such that the face plate 308 can be changed due to end of life, or to provide a new hole pattern. The back surface of the face plate 308 may include mating features to attach and detach from the back plate 306. For example, one suitable mating feature may be a groove and threaded blind holes. According to this example, the groove may mate onto a corresponding lip on the back plate 306. Screw holes on the back plate 306 or face plate 308 are positioned circumferentially and match holes on the mating plate. Screws attach the back plate 306 and face plate 308 together. The number of circumferentially positioned screws may be at least about 4, at least about 10, at least about 24, or at least about 50. Other mating features for the back plate 306 and the face plate 308 may be used. For example, other fastening mechanisms may include straps or clips or a simple friction based engagement may be used where the dimensions of the face plate 308 closely matches those of a corresponding receptacle in the back plate 306. Additional details of attaching the face plate to the back plate are described in U.S. patent application Ser. No. 12/181,927 filed on Jul. 29, 2008 incorporated herein by reference in its entirety for purpose of describing face place attachment. In certain other embodiments, the face plate 308 is not removable from the back plate 306. For example, the two elements may be fabricated from the same block of material or integrated together after fabrication (e.g., welded, fused, pressed). The permanent attachment between the face plate 308 and the back plate 306 may provide enhanced heat transfer between the two components.

FIG. 5 illustrates a temperature controlled showerhead assembly 500 in accordance with certain embodiments. In addition to the showerhead that includes a stem 304, a back plate 306, and a face plate 308 described above, the assembly 500 may also include a heating element 504, a heat exchanger 502, and a temperature sensor 506. Any one of these elements may be removable.

A heating element 504 is thermally coupled to the stem 304 and/or the back plate 306. In certain embodiments, the heating element 504 is one or more cartridge heaters positioned within heating element opening(s) of the stem. For example, two cartridge heaters may be used with a combined power output of between about 250 W and 2,500 W or, more specifically, between about 500 W and 1,500 W. In certain embodiments, the heating element includes RF insulation, for example, by using an EMI/RFI filter or any other commercially available RF isolation device.

As shown in FIG. 5, a thermocouple 506 may be inserted through the opening in the stem 304 and extend through the back plate 306. In certain embodiments, an entire temperature sensor opening 312 is machined from the same block of material. It has been found in some embodiments that welding or otherwise integrating separate pieces of a thermocouple well is prone to cracking during thermal cycling of the showerhead and may result in vacuum leaks and/or malfunction of the thermocouple possibly resulting in thermal runaway of the system. A thermocouple 506 may be between about 0.05 inches and 0.25 inches in diameter on average or, more specifically, between about 0.10 inches and 0.20 inches. The length of the thermocouple is determined by the design of the stem 304 and the back plate 306 and typically allows the thermocouple to extend all the way to the bottom of the opening 312 (see FIG. 3A). In certain embodiments, the thermocouple 506 is between about 4 inches and 8 inches in length or, more specifically, between about 6 inches and 7 inches in length. Another example of a temperature sensing device that may be used instead of the thermocouple 506 is a non-contact temperature sensor (e.g., pyrometry, fluorescence-based thermometry or infrared thermometry).

The thermocouple 506 may also be insulated and isolated from the RF. The RF isolation may be accomplished through operating an RF trap at one frequency and an RF filter at another frequency. Typically, the RF applied in a PECVD operation has two frequency components, a high frequency (e.g., 13.56 MHz) trap and a low frequency (e.g., 400 kHz) one. The RF isolation device may include one or more filters. In one embodiment, the RF isolation device includes a high frequency and a low frequency filter. Without RF isolation, it is believed that the thermocouple measurement would not be useful because the RF interference from the plasma generator would be too great.

Figure 6:
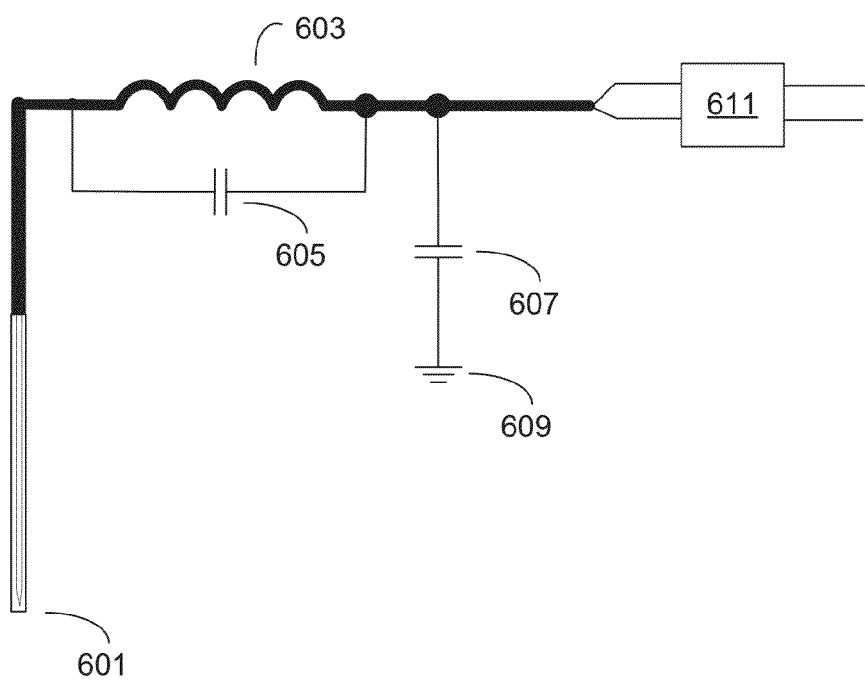
FIG. 6 is a schematic of one embodiment of RF filters used to reduce or eliminate RF noise in accordance with certain embodiments.

A schematic of a possible configuration of the RF isolation device is shown in FIG. 6. The thermocouple 506/601 is surrounded by a stainless steel sheath. This sheath is wound to a coil 603 in parallel to a capacitor 605. The coil acts as an inductor and the capacitor forms a tank circuit which blocks the 13.56 MHz signal. The coil may have an inductance of about 1 microhenry, and capacitor 605 may have a capacitance of about 85 pf (picofarads). Remaining 13.56 MHz RF is shorted to ground 609 with the second capacitor 607, which may have a capacitance of about 10000 pf. Trapping the high frequency with the sheath also blocks the RF in the thermocouple wires embedded in this sheath. The 400 kHz frequency is not blocked by the 603/605 filter and due to its lower frequency not shorted to ground by the capacitor 607. So at the end of the 13.56 MHz filter there is still 400 kHz noise that is subsequently filtered out by the low frequency filter 611. In one design, the low frequency filter may be a two-stage low pass filter. Both stages may be a LC design similar to the high frequency filter. Please note that the low frequency filter may be connected directly to the thermocouple wires, but the high frequency filter may be connected to the sheath only.

Returning to FIG. 5, in order to maintain the face plate 308 at temperatures that are substantially lower than the substrate and the pedestal some heat sometimes needs to be removed from the face plate 308. A heat path is provided between the face plate 308 and the heat exchanger 502 through the back plate 306 and the stem 304. The heat exchanger 502 is configured to remove from or, in certain embodiments, to deliver heat to stem 304. Further, some heat may be removed from the exposed surfaces of the back plate and the stem due to radiation. Each of these heat removal features will now be discussed in more detail.

The heat exchanger 502 may be positioned on the stem 304 such that the two components are thermally coupled. For example, the heat exchanger 502 and the stem 304 may have a contact surface (e.g., a heat exchanger forming a mounting surface at the top of the stem, or a sleeve around the stem) of between about 20 $cm^2$ and 28 $cm^2$. The heat exchanger 502 may be easily removed from the stem without impacting other components of the system or the environment of the deposition chamber.

The temperature in the heat exchanger 502 may be controlled by circulating a cooling fluid through the heat exchanger 502. Examples of cooling fluids include water, an antifreeze solution, and various cooling gases (e.g., clean dry air (CDA), argon, helium, nitrogen, hydrogen, or a mixture of thereof). In particular embodiments, the cooling fluid is water supplied into the heat exchanger at between about 15° C. and 30° C. at a flow rate of at least about 0.5 gallons per minute (GPM). It should be understood that the temperature of the cooling fluid and the flow rate can be adjusted to control the heat flux between the heat exchanger 502 and the stem 304. In certain embodiments, the cooling fluid may be additionally cooled with an external chiller or heated with an external heater. Further, the valve 510 controlling the flow rate of the cooling fluid into the heat exchanger 502 may be adjusted to open or restrict the flow as described below.

In certain less demanding applications, the heat exchanger 502 alone may be used to control the showerhead temperature (i.e., no heating elements are provided in the stem). For example, a showerhead may be heated from other external elements (e.g., a substrate) and the heat exchanger is used only to cool the showerhead down. In other embodiments, the heat exchanger may be configured to provide both heating and cooling by supplying circulating fluid at various temperatures. In other embodiments, the assembly includes one or more heating element 504 as described above.

In addition to cooling provided by the heat exchanger, heat may radiate away from the showerhead surfaces. To improve radiative cooling, the external surface of the stem and/or the showerhead may be coated with a high emissivity material. For example, the coating may be anodized aluminum. The radiation is absorbed by the walls of the chamber that are generally much colder (e.g., around room temperature) than the showerhead components. The chamber top may also be treated with a high emissivity material to increase radiative heat transfer. The inside surface of the chamber top may be also coated with anodized aluminum, for example. The chamber top may be cooled independently, e.g., with cooling water lines.

In certain embodiments, the assembly 500 includes a temperature controller 508. The controller 508 may be used to read the temperature information from the thermocouple 506, and adjusts power delivered to the heater 504 and/or flow rates of the cooling fluid through the heat exchanger 502. For example, if the controller 508 senses that the temperature of the face plate 308 is substantially lower than the set point (e.g., the deposition chamber is being brought up to the operating conditions), it may shut down (or close to a certain degree) the valve 510 and increase the power supplied to the heater 504.

The controller 508 may also be connected to sensors measuring cooling fluid flow rates, temperatures of the cooling fluid when it enters and/or leaves the heat exchanger, and other process parameters. For example, the temperature controller 508 may also take feed forward information. The feed forward information may be the time period until the plasma turns on. In some cases the feed forward information may also include other predictable events that affect the showerhead temperature such as wafer processing with cold wafers or gas flow into the showerhead. For example, the controller 508 may increase the heater output in anticipation of a cooling event, e.g., chamber purge, or decrease the heater input in anticipation of a heating event, e.g., plasma "on." The controller 508 may also increase the cooling by increasing cooling fluid flow in anticipation of a heating event or decrease the cooling by decreasing cooling fluid flow in anticipation of a cooling event.

Various combinations of the input and output components may be used in different controlling schemes. For example, active cooling (modulating cooling fluid flow) may be used with active heating (heater in the back plate) to accurately control showerhead temperature. The showerhead temperature may be measured directly from a thermocouple attached to the face plate, or determined indirectly from the exiting cooling fluid temperature. In some cases, only active cooling or only active heating may be included in the control system. Still other inputs may be included, such as temperature sensing of the cooling fluid at the inlet to accurately determine the heat removed from the showerhead.

Figure 7:
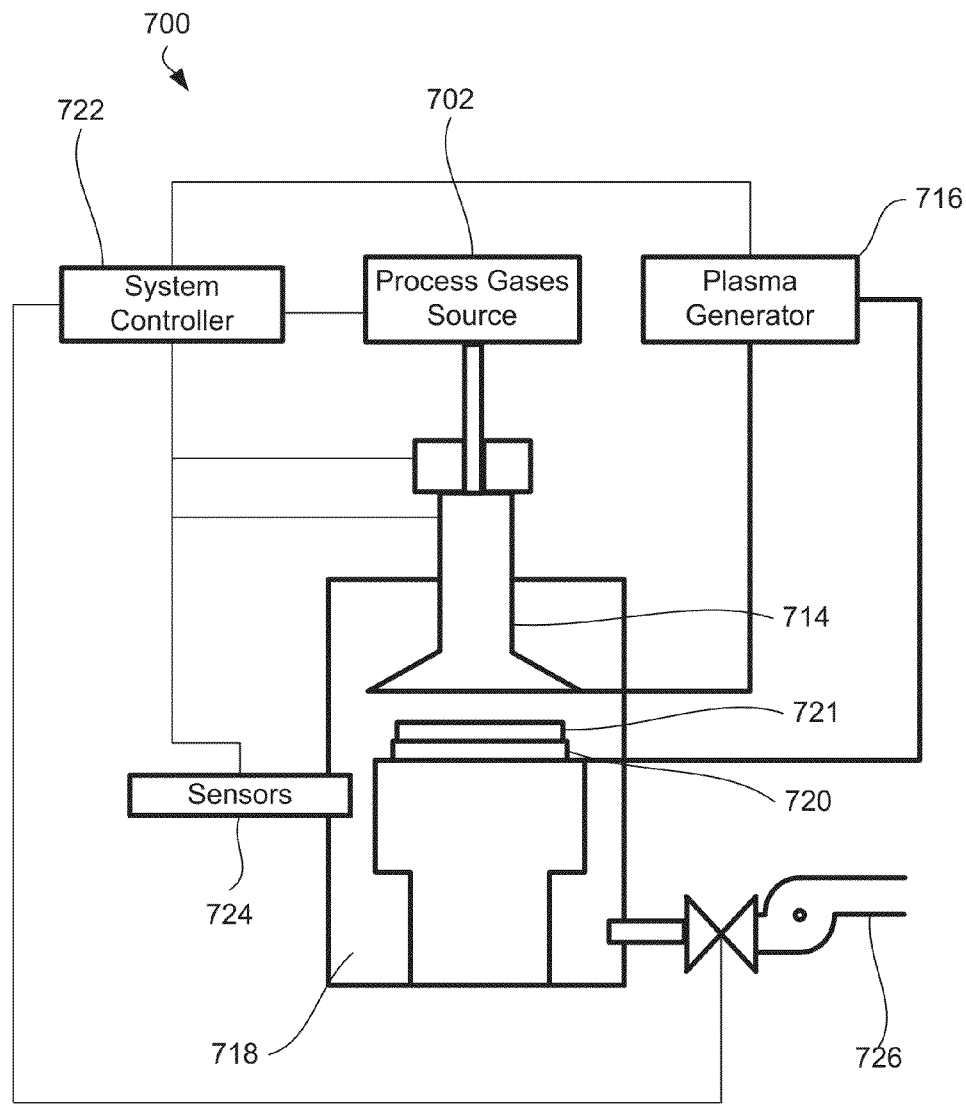
FIG. 7 is a schematic view of a system in accordance with certain embodiments.

FIG. 7 illustrates an example of a deposition system 700 in accordance with certain embodiments of the invention. Examples of the system 700 include a VECTOR Express™ system and a VECTOR Extreme™ system available from Novellus Systems, Inc. in San Jose, Calif. Both of these systems are also available in Ashable Hard Mask (AHM) configurations. It should be noted that a novel showerhead described above could be used in CVD systems without in-situ plasma (e.g., thermal CVD, remote plasma enhanced CVD) and in CVD systems with in-situ plasma (e.g., PECVD, microwave plasma-assisted CVD). For brevity, a PECVD example is illustrated in FIG. 7 and described below. However, it should be noted that the invention is not limited to this type of CVD system.

As shown, the system 700 includes a processing chamber 718, which encloses other components of the system 700 and, in certain embodiments, serves to contain the plasma. The chamber 718 contains a showerhead 714 and other process gas delivery hardware, a substrate pedestal 720, and sensors 724. An optional in-situ plasma generator 716, such as low-frequency RF generator and/or a high-frequency RF generator, may be connected to the showerhead 714 and/or pedestal 720. The power and frequency are sufficient to generate a plasma from the process gas, for example, 400-8000 W total energy for a deposition, and a higher power for a plasma anneal. In certain embodiments, the generators are not used during the deposition, e.g., the deposition takes place in "dark" or non-plasma conditions. During the plasma anneal step, one or more HF, MF and LF generators may be used. For example, in a typical process, the high frequency RF component is generally between 2-60 MHz; in a preferred embodiment, the component is 13.56 MHz.

Within the processing chamber 718, the pedestal 720 supports a substrate 721. The pedestal 720 typically includes a chuck, and lift pins to raise and lower the substrate 721 during and between the deposition and/or plasma treatment reactions. The chuck may be an electrostatic chuck, a mechanical chuck, a vacuum chuck or various other types of chuck as are available for use in the industry and/or research.

The process gases are introduced into the chamber 718 through the showerhead 714 from one or more process gases source 702. The source 702 may include valves and mass flow controllers (MFCs). It may be controlled by a system controller 722 in such a way that desirable ratios of the process gases' concentrations or partial pressures are achieved in the process chamber. Reaction products and other gases exit the chamber 718 via an outlet 726. A vacuum pump (e.g., a one or two stage mechanical dry pump and/or a turbomolecular pump) typically draws process gases out and maintains a suitably low pressure within the processing chamber by a closed loop-controlled flow restriction device, such as a throttle valve or a pendulum valve.

The chamber 718 may include a sensor 724 for sensing various process parameters, such as temperatures of the substrate 721 and the pedestal, chamber pressure, concentration of process gases inside the chamber, and others. The sensor 724 may provide sensed information to the system controller 722. Examples of the sensor 724 include residual gas analyzers, pressure sensors, thermocouples, infrared pyrometers, and others. It should be noted that other sensors may be included in the showerhead 714 as described above.

In certain embodiments, a system controller 722 is employed to control process parameters. The system controller 722 typically includes one or more memory devices and one or more processors. The processor may include a CPU or computer, analog and/or digital input/output connections, stepper motor controller boards, etc. Typically there will be a user interface associated with system controller 722. The user interface may include a display screen, graphical software displays of the apparatus and/or process conditions, and user input devices such as pointing devices, keyboards, touch screens, microphones, etc. Although the system controller 722 is shown connected to plasma generator 716, its placement and connectivity may vary based on the particular implementation.

In certain embodiments, the system controller 722 incorporated some or all functions of the temperature controller described above (element 508 in FIG. 5). For example, the system controller 722 may gather information on temperature of the face plate and use this information to adjust heater output and/or flow through the heat exchanger. The system controller 722 executes system control software including sets of instructions for controlling temperatures, flow rates of gases and liquids, chamber pressure, substrate temperature, timing of various operations, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions that are provided to the user in the form of a recipe, and may be entered utilizing the user interface. Signals for monitoring the process may be provided by analog and/or digital input connections of the system controller 722. The signals for controlling the process are output on the analog and digital output connections of the apparatus 700.

An apparatus 700 may be a multi-station or a single-station apparatus. In a multi-station configuration, the chamber 718 may have a number of stations, for example, two stations, three stations, four stations, five stations, six stations, seven stations, eight stations, ten stations, or any other number of stations. This number is usually determined by complexity of the overall process and/or ability of different operations to share the same environment. In certain embodiments, two or more stations in a multi-station apparatus are exposed to the same processing environment (e.g., pressure). However, each station may have individual local plasma and/or heating conditions achieved by a dedicated plasma generator and heated pedestal.

In certain embodiments, an apparatus 700 may be a part of a multi-chamber system. For example, a system may have two, three, or even four separate chambers with one or more stations in each chamber. Each chamber may have one or more corresponding transfer ports (e.g., load-locks) in order to independently control internal environments in each chamber.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A temperature controlled showerhead assembly for use in a chemical vapor deposition (CVD) apparatus, the temperature controlled showerhead assembly comprising:
   a heat conductive stem, wherein the heat conductive stem comprises:
      a heat exchanger;
      a replaceable heating element;
      a seat configured to receive the heat exchanger, the heat exchanger positioned on the seat and thermally coupled to the heat conductive stem; and
      an opening configured to receive the replaceable heating element, the replaceable heating element thermally coupled to the heat conductive stem;
   a back plate attached to the heat conductive stem;
   a face plate thermally coupled to the heat conductive stem and attached to the back plate, the back plate including three or more stacked substantially solid disks decreasing in diameter from the attachment at the face plate to the attachment at the heat conductive stem, wherein the disk at the attachment at the face plate is configured to distribute a flow of gas to the face plate; and
a temperature sensor thermally coupled to the face plate,
wherein the temperature controlled showerhead is configured to maintain the temperature of the face plate within a predetermined range by providing heat transfer paths between the heating element and the face plate and between the heat exchanger and the face plate.

2. The temperature controlled showerhead assembly of claim 1, wherein a solid cross-section of the heat conductive stem is at least about 5 square inches on average along the length of the shaft portion.

3. The temperature controlled showerhead assembly of claim 1, wherein one or more components selected from the group consisting of the heat conductive stem, the back plate, and the face plate comprising a material with a thermal conductivity of at least about 150 Watts per meter per Kelvin.

4. The temperature controlled showerhead assembly of claim 1, wherein one or more components selected from the group consisting of the heat conductive stem, the back plate, and the face plate comprising a material selected from the group consisting of aluminum 6061 and aluminum 3003.

5. The temperature controlled showerhead assembly of claim 1, wherein an average thickness of the back plate is at least about 2 inches.

6. The temperature controlled showerhead assembly of claim 1, wherein an average thickness of the face plate is between about 0.5 inches and 1 inch.

7. The temperature controlled showerhead assembly of claim 1, wherein an average gap between the face plate and the back plate is between about 0.25 inch and 0.75 inch.

8. The temperature controlled showerhead assembly of claim 1, wherein a contact area between the face plate and the back plate is between about 30 square inches and 50 square inches.

9. The temperature controlled showerhead assembly of claim 1, wherein the face plate has a diameter of between about 13.5 inches and 16.5 inches.

10. The temperature controlled showerhead assembly of claim 1, wherein the heat exchanger comprises a convective cooling fluid passageway configured to allow for a flow of a cooling fluid.

11. The temperature controlled showerhead assembly of claim 10, wherein the cooling fluid is selected from the group consisting of water and a liquid antifreeze solution.

12. The temperature controlled showerhead assembly of claim 1, wherein the heat exchanger is positioned within about 7 inches from the face plate.

13. The temperature controlled showerhead assembly of claim 1, wherein the temperature controlled showerhead assembly is configured to maintain the temperature of the face plate at between about 200° C. and 300° C. for an emissivity of the face plate at between about 0.2 and 0.8.

14. The temperature controlled showerhead assembly of claim 1, wherein the heating element comprises two cartridge heaters each configured to provide power output of at least about 500 W.

15. The temperature controlled showerhead assembly of claim 1, wherein the stem comprises a top surface and wherein the opening is at the top surface of the stem.

16. The temperature controlled showerhead assembly of claim 1, wherein the stem comprises a top surface and wherein the temperature sensor is positioned within the stem and configured to be placed into the stem and removed from the stem through the top surface.

17. The temperature controlled showerhead assembly of claim 1, wherein an external surface of one or more elements selected from the group consisting of the stem and the back plate comprises a high emissivity surface.

18. The temperature controlled showerhead assembly of claim 17, wherein the high emissivity surface is anodized aluminum.

19. The temperature controlled showerhead assembly of claim 1, wherein the face plate has a plurality of through holes configured for uniform distribution of process gases.

20. The temperature controlled showerhead assembly of claim 1, wherein the heat exchanger is removably mounted on the seat of the heat conductive stem of the temperature controlled showerhead assembly.

21. The temperature controlled showerhead assembly of claim 1, wherein the temperature sensor is removable from the temperature controlled showerhead assembly.

22. The temperature controlled showerhead assembly of claim 1, wherein the back plate and the face plate are integrated together to form a single unified body.

23. The temperature controlled showerhead assembly of claim 1, wherein each of the stacked disks has a different thickness.

24. The temperature controlled showerhead assembly of claim 1, wherein the disk at the attachment at the face plate is configured to distribute the flow of gas to a gap between the back plate and the face plate.

25. A temperature controlled showerhead assembly for use in a chemical vapor deposition (CVD) apparatus, the temperature controlled showerhead assembly comprising:
a heat conductive stem comprising aluminum 6061, wherein the heat conductive stem further comprises:
a heater exchanger;
one or more cartridge heaters;
a seat configured to receive the heat exchanger, the heat exchanger positioned on the seat and thermally coupled to the heat conductive stem; and
an opening configured to receive the one or more cartridge heaters, each cartridge heater configured to provide power output of at least about 500 W, the one or more cartridge heaters thermally coupled to the heat conductive stem;
a back plate comprising aluminum 6061 and having an average thickness of at least about 2 inches, wherein the back plate is attached to the heat conductive stem;
a face plate comprising aluminum 6061 and having an average thickness of between about 0.5 inches and 1 inch, wherein the face plate is thermally coupled to the heat conductive stem and attached to the back plate with an average gap between the face plate and the back plate of between about 0.25 inch and 0.75 inch, the back plate including three or more stacked substantially solid disks decreasing in diameter from the attachment at the face plate to the attachment at the heat conductive stem, wherein the disk at the attachment at the face plate is configured to distribute a flow of gas to the gap between the face plate and the backplate; and
a temperature sensor thermally coupled to the face plate,
wherein the temperature controlled showerhead is configured to maintain the temperature of the face plate within a predetermined range by providing heat transfer paths between the heating element and the face plate and between the heat exchanger and the face plate.

26. A Chemical Vapor Deposition (CVD) system for depositing a semiconductor material on a partially manufactured semiconductor substrate, the CVD system comprising:
a processing chamber configured to maintain a low pressure environment within the processing chamber;

a substrate support for holding the partially manufactured semiconductor substrate and maintaining a temperature of the partially manufactured semiconductor substrate at between about 500° C. and 600° C.;

a temperature controlled showerhead assembly comprising:
- a heat conductive stem, wherein the heat conductive stem comprises:
  - a heat exchanger;
  - a replaceable heating element;
  - a seat configured to receive the heat exchanger, the heat exchanger positioned on the seat and thermally coupled to the heat conductive stem; and
  - an opening configured to receive the replaceable heating element, the replaceable heating element thermally coupled to the heat conductive stem;
- a back plate attached to the heat conductive stem;
- a face plate thermally coupled to the heat conductive stem and attached to the back plate, the back plate including three or more stacked substantially solid disks decreasing in diameter from the attachment at the face plate to the attachment at the heat conductive stem, wherein the disk at the attachment at the face plate is configured to distribute a flow of gas to the face plate; and
- a temperature sensor thermally coupled to the face plate, wherein the temperature controlled showerhead is configured to maintain the temperature of the face plate within a predetermined range by providing heat transfer paths between the heating element and the face plate and between the heat exchanger and the face plate.

27. The CVD system of claim 26, wherein the face plate of the temperature controlled showerhead is positioned within about 0.7 inches from the substrate support and wherein the temperature controlled showerhead is configured to maintain the temperature of the face plate at between about 200° C. and 300° C. while the substrate support is maintained at between about 500° C. and 550° C.

28. The CVD system of claim 26, further comprising an in-situ plasma generator.

29. The CVD system of claim 26, wherein the CVD system is a single-station deposition system.

30. The CVD system of claim 26, further comprising a second substrate support.

31. The CVD system of claim 30, wherein the substrate support and the second substrate support are positioned inside the processing chamber and are configured to be exposed to the same low pressure environment.

32. The CVD system of claim 30, further comprising a second processing chamber configured to maintain a different environment than the processing chamber, wherein the substrate support is positioned in the processing chamber and the second substrate support is positioned in the second processing chamber.

33. The CVD system of claim 26, wherein the back plate and the face plate are integrated together to form a single unified body.

34. The temperature controlled showerhead assembly of claim 26, wherein the disk at the attachment at the face plate is configured to distribute the flow of gas to a gap between the back plate and the face plate.

* * * * *